United States Patent
Gurba et al.

(10) Patent No.: US 7,087,440 B2
(45) Date of Patent: Aug. 8, 2006

(54) MONITORING OF NITRIDED OXIDE GATE DIELECTRICS BY DETERMINATION OF A WET ETCH

(75) Inventors: April Gurba, Plano, TX (US); Husam Alshareef, Murphy, TX (US); Hiroaki Niimi, Tokyo (JP)

(73) Assignee: Texas Instruments Corporation, Dallas, TX (US)

( * ) Notice: Subject to any disclaimer, the term of this patent is extended or adjusted under 35 U.S.C. 154(b) by 0 days.

(21) Appl. No.: 10/444,244

(22) Filed: May 23, 2003

(65) Prior Publication Data

US 2004/0235203 A1    Nov. 25, 2004

(51) Int. Cl.
H01L 21/00    (2006.01)
H01L 21/31    (2006.01)

(52) U.S. Cl. .................... 438/8; 438/287; 438/705; 438/786

(58) Field of Classification Search ............ 438/8, 438/287, 705, 786
See application file for complete search history.

(56) References Cited

U.S. PATENT DOCUMENTS

| | | | | |
|---|---|---|---|---|
| 3,691,627 A | * | 9/1972 | Engeler | 438/301 |
| 4,764,248 A | * | 8/1988 | Bhattacherjee et al. | 438/439 |
| 6,057,583 A | * | 5/2000 | Gardner et al. | 257/408 |
| 6,303,962 B1 | * | 10/2001 | Gardner et al. | 257/347 |
| 6,323,519 B1 | * | 11/2001 | Gardner et al. | 257/336 |
| 6,342,450 B1 | * | 1/2002 | Lattard | 438/696 |
| 6,450,116 B1 | * | 9/2002 | Noble et al. | 118/723 R |
| 6,548,343 B1 | * | 4/2003 | Summerfelt et al. | 438/240 |
| 6,563,578 B1 | * | 5/2003 | Halliyal et al. | 356/237.4 |
| 2004/0023403 A1 | * | 2/2004 | Tatsunari | 436/144 |

* cited by examiner

Primary Examiner—Hsien-Ming Lee
(74) Attorney, Agent, or Firm—Yingsheng Tung; Wade James Brady, III; Frederick J. Telecky, Jr.

(57) ABSTRACT

The present invention provides, in one embodiment, a method method of monitoring a process for forming a nitridated oxide gate dielectric. A nitrided oxide dielectric layer is formed on a test substrate (110). The nitrided oxide dielectric layer is exposed to an etch process (120). A change in a property of the nitrided oxide dielectric layer is measured as a function of the etch process (130). Other embodiments advantageously incorporate the method into methods for making semiconductor devices and integrated circuits.

16 Claims, 6 Drawing Sheets

MONITORING OF NITRIDED OXIDE GATE DIELECTRICS BY DETERMINATION OF A WET ETCH

TECHNICAL FIELD OF THE INVENTION

The present invention is directed, in general, to the manufacture of semiconductor devices, and, more specifically, to a method of monitoring the quality production of nitrided oxide dielectrics in semiconductor devices.

BACKGROUND OF THE INVENTION

Reducing the dimensions of a gate dielectric of a semiconductor device, such as a metal oxide semiconductor (MOS) field effect transistor (FET), improves the performance of the device. For instance, a thinner gate dielectric is desirable because this increases the capacitance and the operating frequency of the transistor. Gate dielectrics are often made by thermally growing silicon dioxide ($SiO_2$) to a thickness of about 20 Angstroms or less. Such ultra-thin gate oxides, however, encounter a number of problems, including dopant penetration from the electrode material and direct carrier tunneling. This, in turn, causes high leakage current and threshold voltage effects thereby degrading device performance and device reliability.

These problems can be minimized by nitridation of the gate oxide. Nitrogen incorporation allows for thicker gate oxides to be produced but with electrical properties that are equivalent to an ultra-thin gate oxide. The thicker gate inhibits or reduces the problems previously mentioned. The performance characteristics of transistors depend on both the concentration and distribution of nitrogen atoms incorporated into the gate dielectric. If the nitrogen content of the gate oxide changes, then the electrical characteristics of the transistor will also change. For instance, if the nitrogen content of the gate oxide decreases, then the gate oxide will have the unsuitable electrical characteristics of a thicker gate.

It is desirable to have the ability to monitor the nitridation process both between wafers and within wafers so as to manufacture devices having uniform properties. Consider, for example, a 200 mm diameter semiconductor wafer comprising about 100 to about 1000 integrated circuit chips. Preferably, each integrated circuit chip on the wafer has transistors whose performance characteristics are substantially identical. Furthermore, it is advantageous for chips constructed on different wafers to have substantially identical performance. It is also advantageous if the monitoring of the gate oxide nitridation process can be employed in or near a transistor production facility so that corrections to the nitridation process can be made rapidly during mass production. Previous procedures used to monitor the gate oxide nitridation process are problematic, however.

Previous methods to monitor gate oxide nitridation entailed quantifying the nitrogen content of the gate oxide. Examples include time-of-flight (ToF) secondary ion mass spectroscopy (SIMS), or X-ray photoelectron spectroscopy (XPS). A determination of the nitrogen content, however, is usually done on only one sample per wafer. In addition, these methods usually require significant amounts of production time to transport the gate oxide sample from the production facility to the analytical lab to have it analyzed. During this time period, even though the quality of nitridation is unknown, wafer lot production continues. Thus, wafers can be produced during this analytical time period that may not fall within desirable design parameters.

Other disadvantages associated with present processes stem from the fact that the rapid determination of changes in the nitrogen content of the gate oxides being fabricated in the production facility is not completely ideal. For instance, it is not optimally desirable to use the above-mentioned analytical methods to monitor and compensate for inadvertent drifts in the process used for nitridating gate oxides in a production environment due to the time factors mentioned above and the questionable impact on the quality of the nitrided gate oxide. It is also very difficult to monitor non-uniformities in the nitrogen content of the gate oxide formed across the surface of individual wafers in a production environment.

Accordingly, what is needed in the art is an improved method of monitoring the nitration of gate oxides in transistors that avoid the above-mentioned limitations.

SUMMARY OF THE INVENTION

To address the above-discussed deficiencies of the prior art, one embodiment is directed to a method of monitoring a process for forming a nitrided oxide gate dielectric. The method includes forming a nitrided oxide dielectric layer on a test substrate and exposing the nitrided oxide dielectric layer to an etch process. The method further comprises measuring a change in a property of the nitrided oxide dielectric layer as a function of the etch process.

Another embodiment provides a process for manufacturing a semiconductor device. The processes comprises forming an oxide layer on a substrate and nitridating oxide layer to form a nitrided oxide dielectric layer. The process further includes exposing a test sample of the nitrided oxide dielectric layer to an etch process and measuring a change in a property of the test sample as function of the etch process.

Yet another embodiment is a process for manufacturing an integrated circuit. The process includes forming a test nitrided oxide layer on a test substrate using an oxide nitridation process. The test nitrided oxide layer is exposed to an etch process. The process further comprises measuring a change in a property of the test nitrided oxide layer as a function of the etch process. The process also includes forming transistors on a production substrate when the property falls within an accepted range. Forming transistors includes forming a gate on a production nitrided gate oxide layer formed with the oxide nitridation process. The transistors are interconnected to form an operative integrated circuit.

The foregoing has outlined preferred and alternative features of the present invention so that those of ordinary skill in the art may better understand the detailed description of the invention that follows. Additional features of the invention described hereinafter can also form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages of using an etching process to monitor the nitridation of a gate oxide to provide more current quality data regarding the nitridation process. Certain embodiments make advantageous use of the present discovery that etch rates of silicon dioxide layers change as a function of certain process conditions used to nitridate the layer. For instance, while not limiting the scope of the invention by theory, it is believed that the extent of nitridation and rapid thermal annealing cause changes in the structure of the resulting silicon oxynitride that changes the silicon oxynitride's properties, including its resistance to etching. By using carefully controlled etching conditions, it is possible to relate changes in the properties of the nitrided oxide layer to changes in the processing conditions used to nitridate the oxide layer.

Therefore it is possible to monitor more current changes in the nitridation process by determining changes in the property of the nitridated oxide layer as a function of the etch process. A change in the nitridation process, in turn, provides an indication that the performance of a semiconductor device having a nitridated oxide gate dielectric could change beyond certain target performance characteristics. The availability of such information advantageously allows one to modify the manufacturing process to maintain the production of semiconductor devices having uniform electrical properties.

Figure 1A:
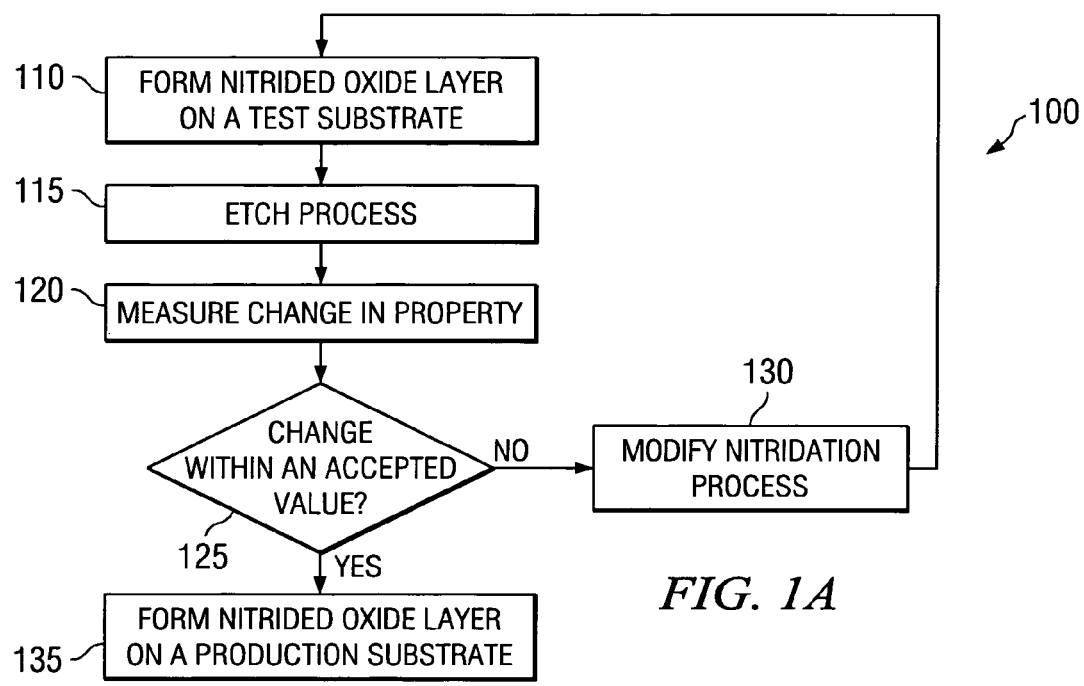
FIGS. 1A to 1B illustrates by flow diagram selected steps in a method of monitoring a process for forming a nitrided oxide gate dielectric.

One embodiment is a method of monitoring a process for forming a nitridated oxide gate dielectric. FIG. 1 illustrates by flow diagram, selected steps in an embodiment of the method 100. A nitrided oxide dielectric layer is formed on a test substrate in step 110. In step 115, the nitrided oxide dielectric layer is exposed to an etch process. The method further includes, in step 120, measuring a change in a property of the nitrided oxide dielectric layer as a function of the etch process. In a further embodiment, at step 125, it is determined if the change is within an accepted value range. If no, at step 130, the nitridation process is modified and the process starts again at step 110. If yes, at step 135, the process is used to form a nitrided oxide layer on a production wafer.

In some preferred embodiments, the test substrate is a test wafer that is dedicated to monitoring the nitridation process. The test wafer is not further treated beyond the steps in the nitridation process as further described below. In an alternative embodiment, however, the test substrate comprises a portion of a semiconductor wafer used to form functional devices thereon. In such embodiments, substantially the same nitridation process is applied to other portions of the semiconductor wafer to manufacture integrated circuits.

Any conventional nitridation agent and process may be used to form the nitrided oxide dielectric layer. Suitable nitridation agents are molecular nitrogen ($N_2$), ammonia ($NH_3$), nitric oxide (NO), nitrous oxide ($N_2O$) or other nitrogen sources well known to those skilled in the art. Nitrogen exposure may include the use of plasma, ion implantation, optical excitation, including laser excitation, or thermal processing to form silicon oxynitride. In some embodiments, the nitrided oxide dielectric layer is preferably formed by first thermally growing an oxide layer on a substrate and then nitridating the oxide layer.

In the various embodiments covered by the present invention, nitridation may be accomplished using a conventional plasma nitridation process. Examples include radio-frequency or microwave plasma nitridation processes. In some embodiments, the plasma nitridation process is carried out between about 5 and about 180 seconds, and more preferably between about 35 and about 55 second. Preferred conditions for plasma nitridation include a chamber pressure between about 10 mTorr and about 10 Torr, chamber temperature between about 20° C. and about 500° C., and plasma power between about 100 Watts and about 3000 Watts. In certain preferred embodiments, the RF plasma power range is between about 100 Watts and about 3000 Watts. In other preferred embodiments the microwave plasma power range is between about 600 Watts and about 3000 Watts. As discussed below with respect to an alternative embodiment, the nitridation process may be followed by a rapid thermal anneal (RTA).

As noted above, in step 110, the nitrided oxide dielectric layer is exposed to an etch process. The etch process preferably comprises exposing the nitrided oxide dielectric layer to a wet etchant capable of removing the layer as a function of the etch process, such as the time of exposure to the etchant. Preferably, the etch process includes exposing the nitrided oxide dielectric layer to an aqueous solution containing hydrofluoric acid (HF) in a wet-etch chamber. In certain preferred embodiments, the HF solution is buffered, by further including ammonium fluoride($NH_3F$). In one preferred embodiment, for example, the buffered HF solution comprises a 1:100 mixture of about 49% (wt./vol.) HF and 41% (wt./vol.) ammonium fluoride($NH_3F$).

In certain exemplary embodiments, the etch process includes exposing the nitrided oxide dielectric layer to the wet etchant for between about 10 and about 140 seconds at a temperature between about 20° C. and about 25° C. In other preferred embodiments, however, it is desirable to use a dilute HF solution in the etch process. For example, when the thickness of nitrided oxide dielectric layer is about 10 Angstroms or less, a dilute HF solution comprising about 0.49% (wt./vol.) HF is used for etching.

As noted above, in step 120, a change in property of the remaining nitrided oxide dielectric layer is measured as a function of the etch process. The change in property value may be measured in a number of ways. For example, the change in property can be measured using optical spectroscopy. In certain preferred embodiments, for example, the property measured is a change in thickness of the nitrided oxide dielectric layer before and after the etch process.

In certain advantageous embodiments of the method 100, optical spectroscopy procedures, such as ellipsometry or reflectometry, are used to monitor the change in thickness. Such procedures involve detecting light reflected from the surface of the nitrided oxide dielectric layer. The spectral characteristics of the reflected light can be correlated to a thickness, or change in thickness, in the nitrided oxide dielectric layer using conventional methods well known to those skilled in the art. These optical spectroscopy procedures are advantageous because they can be performed in a semiconductor fabrication facility, thereby providing an assessment of the nitridation process in real time or near-real time.

The above-described optical spectroscopy procedures are also advantageous because they can be used to assess the uniformity of nitrided oxide dielectric layer across the surface of the test substrate. This is done by measuring the spectral characteristics of light reflected from a plurality of discrete locations of the test substrate. In certain embodiments of the method 100, for example, reflectance measurements are made, before and after the etch process, from 21 discrete locations on a test wafer substrate supporting the nitrided oxide dielectric layer.

In preferred embodiments of the method 100, measuring a change in the property nitrided oxide dielectric layer further includes comparing the change in the property to an accepted value, in step 125. To facilitate the comparison to an accepted change thickness, a standard nomogram can be constructed. The standard nomogram relates the expected change in property of the nitrided oxide dielectric layer to a range of production conditions.

For example, the standard nomogram presents accepted changes in thickness of the layer for specific conditions of plasma nitridation and RTA. To create the standard nomogram, the change thickness for a particular etch process is measured for a several test layers each produced under different well-characterized and accepted plasma nitridation and RTA conditions. The relationship between the change in thickness, plasma nitridation time and RTA temperature is then plotted to form the nomogram. Of course, the comparison to an accepted change in thickness could be accomplished by other methods, such as computerized representations of analogous information contained in the standard nomogram.

As mentioned above, if the comparison made in step 125 indicates a change in property that is substantially different from the accepted value, then the nitridation process is modified in step 130. In some embodiments, for example a substantial difference is indicated when the change in thickness of the nitrided oxide dielectric layer is greater about ± two standard deviations of the average thickness expected for a certain set of adopted nitridation process conditions. In such instances, the nitridation process conditions are modified such that a subsequently produced test substrate, monitored by the above-describe method, has a change in property that is within a predefined range of an accepted value. When the change in property is within the accepted value the nitridation process is used to form a nitrided oxide dielectric layer in a production substrate, in step 135.

Figure 1B:
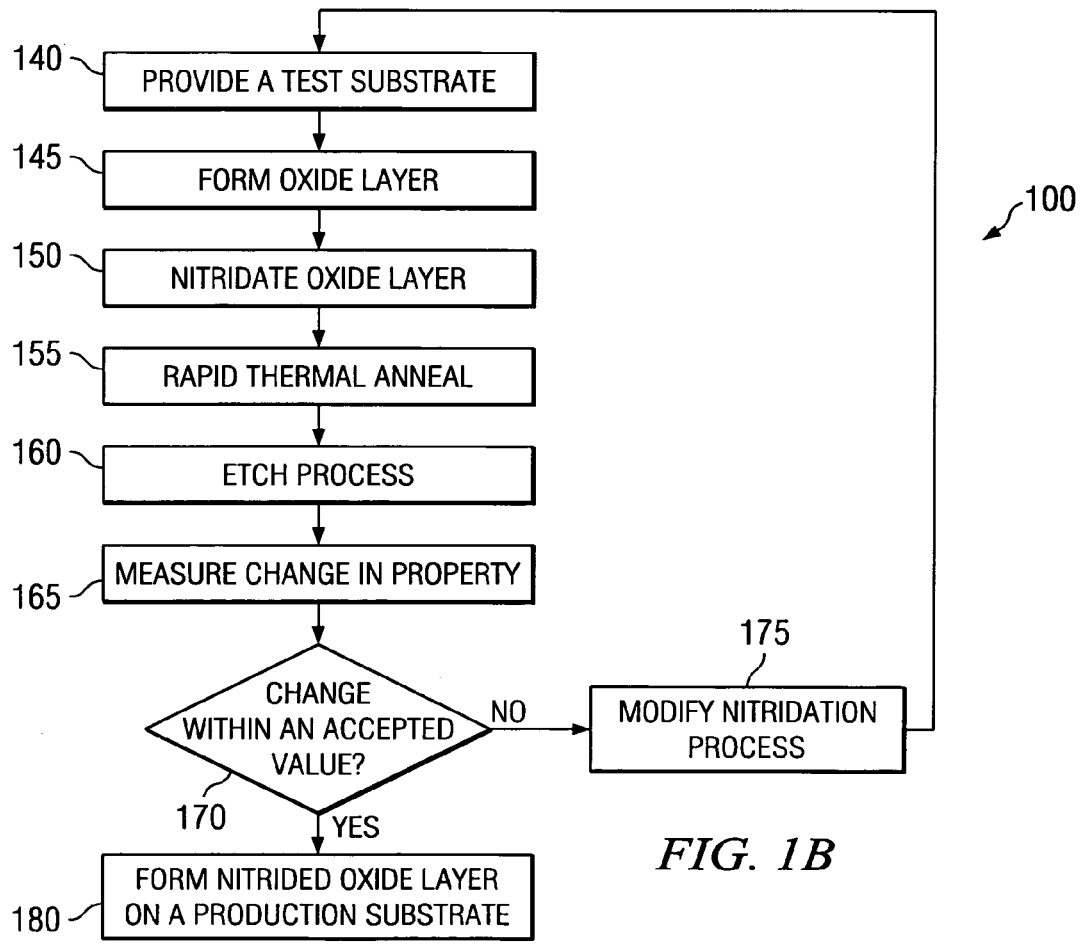

FIG. 1B illustrates an alternative embodiment of the method 100 described above. In this exemplary embodiment, a test substrate is provided at step 140. The test substrate is preferably silicon, but can be any substrate suitable for integrated circuit construction. An oxide layer is formed on the test substrate at step 145. The oxide layer is preferably formed by thermally growing silicon dioxide to a desired thickness under conditions well known to those of ordinary skill in the art. In certain embodiments, for example, the oxide layer is less than about 30 Angstroms thick, and more preferably between about 10 and about 20 Angstroms thick. At step 150 the oxide layer is exposed to the nitridation process, as described above. However, in this embodiment, the nitridation process is preferably followed by a rapid thermal anneal (RTA), in step 155. The RTA functions to repair any surface defects formed during the plasma nitridation process. In some embodiments, the RTA comprises a temperature of between about 600° C. and about 1000° C. for between about 1 and about 60 seconds. At step 160, the previously described etch is conducted and the change in property value is conducted at step 165. A determination of whether the value is acceptable is then made at step 170. If no, at step 175, the nitridation process is modified and the process starts again at step 140. If yes, at step 185, the process is used to form a nitrided oxide layer on a production wafer.

Another embodiment is a process for manufacturing a semiconductor device. FIGS. 2A to 2D illustrate sectional views of selected steps in an exemplary process of manufacturing a semiconductor device 200. Any of the embodiments of the method 100 described above and illustrated in FIGS. 1A and 1B can be incorporated into the semiconductor device 200 manufacturing process.

Figure 2A:
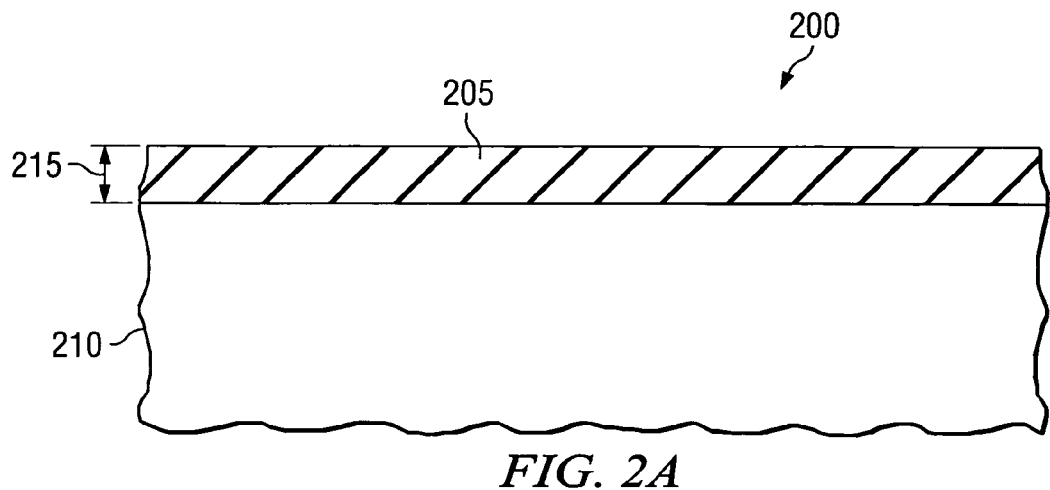
FIGS. 2A to 2E illustrate sectional views of selected steps in a method of manufacturing a transistor.

Turning now to FIG. 2A, shown is a partial sectional view of a conventionally formed oxide layer 205 on a substrate 210. Any of the above-described embodiments of the oxide layer 205 and substrate 210 may be used in the process for manufacturing the semiconductor device 200. For example, in certain embodiments, the substrate 210 comprises silicon and the oxide layer 205 comprises silicon dioxide. In certain preferred embodiments, the oxide layer has a thickness 215 between about 5 Angstroms and 30 Angstroms thick, and more preferably between about 15 Angstroms and about 25 Angstroms thick.

Figure 2B:
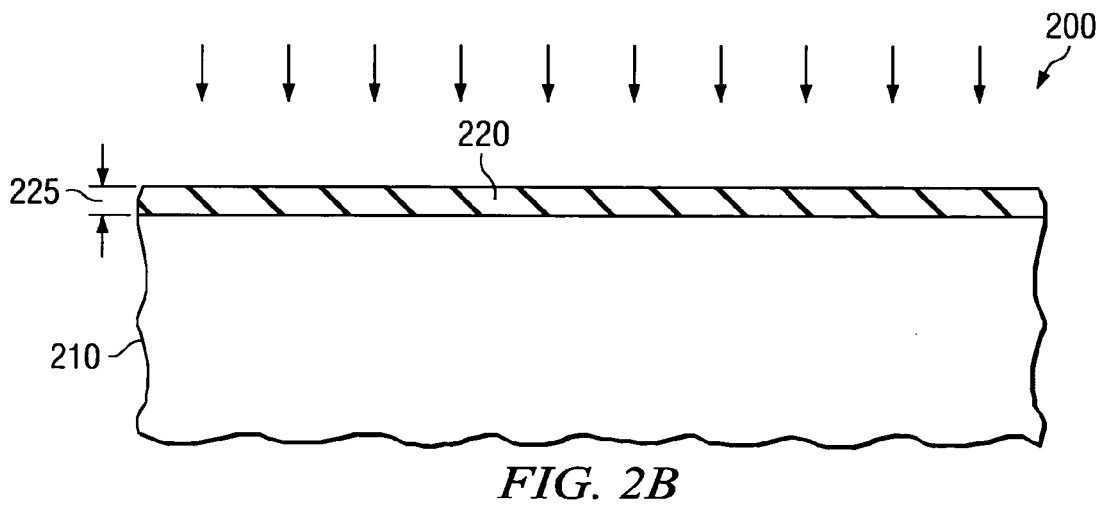

FIG. 2B depicts the formation of a nitrided oxide dielectric layer 220 by nitridating, as indicated by the arrows, the oxide layer 205 shown in FIG. 2A. The nitrided oxide dielectric layer may be formed by any of the above-described nitridation processes, such as the plasma nitridation process. As noted above, in certain embodiments, it is preferable for the nitridation process to further include an RTA after the plasma nitridation process. Preferably, the thickness 225 of the resulting nitrided oxide dielectric layer is substantially the same as the thickness of the oxide layer 215. In other embodiments, however, the physical thickness 225 of the nitrided oxide dielectric layer is up to about 10 to about 20 percent larger than the thickness of the oxide layer 215.

Figure 2C:
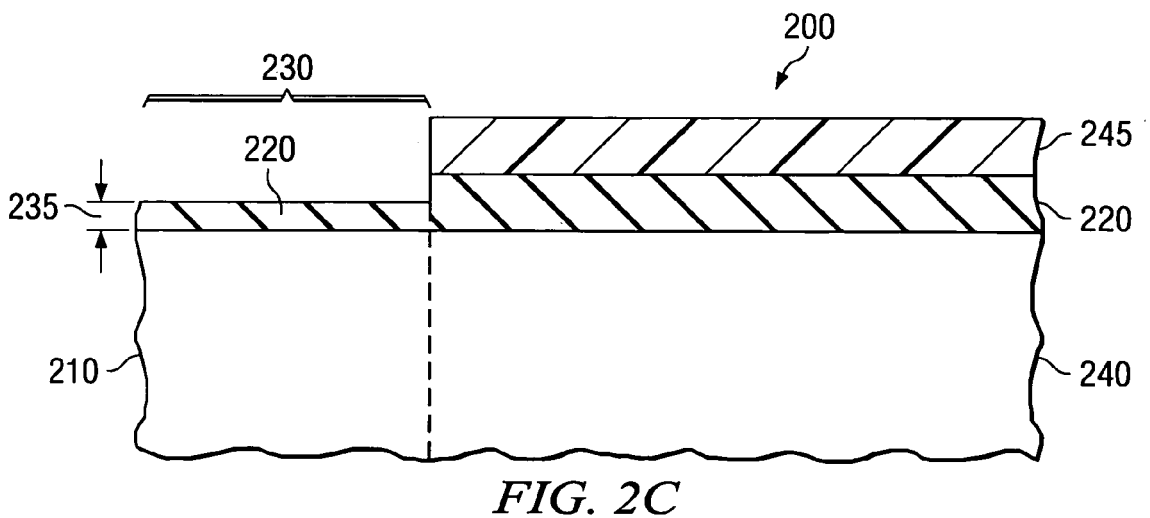

FIG. 2C illustrates exposing a test sample 230 of the nitrided oxide dielectric layer to an etch process, thereby reducing its thickness 235. Any of the etchants and methods illustrated in FIG. 1 and accompanying text can be incorporated into the etch process.

In some preferred embodiments, the test sample 230 is located on a different wafer than the production substrate 240. In other embodiments, however, the test sample 230 is located on a wafer that also includes a production substrate 240. In such embodiments, the production substrate 240 can be subject to the above-described process of forming the nitrided oxide dielectric layer 215. The nitrided oxide dielectric layer 215 formed on the production substrate 240 is not subject to etch process, however. One skilled in the art would understand how to suitably prevent the production substrate 240 from being exposed to the etch process. For example, an etchant resistant mask layer 245 is formed over the production substrate 240 when the test sample 230 is exposed to the etch process. The mask 245 is then removed before proceeding with additional manufacturing steps of the semiconductor device as further described below.

Figure 2D:
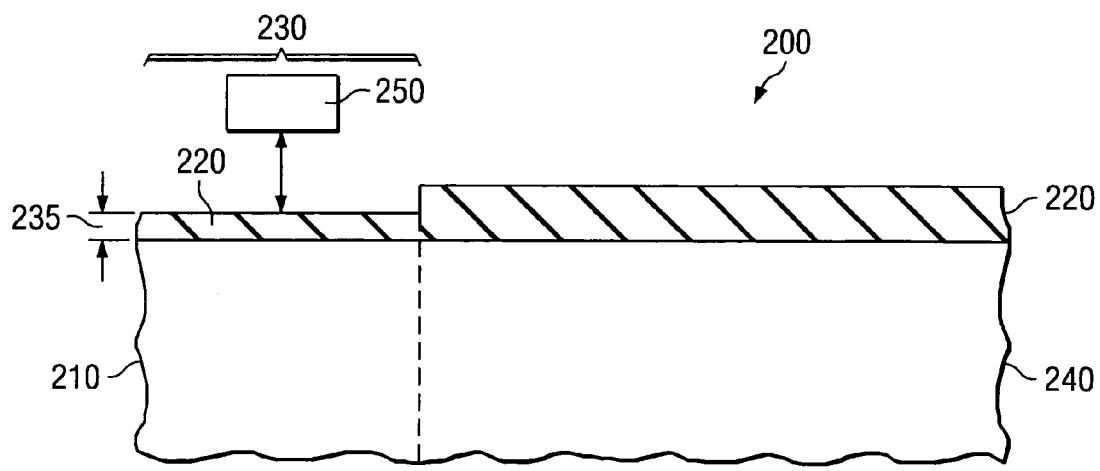

FIG. 2D illustrates measuring a change in a property of the test sample 230 as function of the etch process. In certain preferred embodiments for example, measuring entails determining the thickness of the nitrided oxide dielectric layer 220 before (225, FIG. 2B) and after (235, FIG. 2C) the etch process, and determining a change in thickness of the layer 220. As indicated previously, in some embodiments an optical spectrometer 250, such as an ellipsometer or reflectometer, is used to measure the change in thickness of the nitrided oxide dielectric layer 220.

In certain preferred embodiments, measuring a change in a property includes comparing the changed property to an accepted value. In some embodiments, for instance, the change in thickness is compared to an accepted change in thickness of the nitrided oxide dielectric layer 220 under predefined standardized nitridation and etching conditions. If the change in property is within an accepted value, then the nitridation procedure to form the nitrided oxide dielectric layer is applied to the production substrate 240. Alternatively, if the changed property is substantially different from the accepted value, then the nitridation procedure is modified before being applied to the production substrate 240. One skilled in the art would understand how to suitably modify the nitridation procedure such that the nitrided oxide dielectric layer formed has a changed property within the accepted range.

Consider the situation, for example, when the change in thickness of the test sample 230 following the etch process is greater than an accepted change in thickness under standardized etch conditions. One may choose to increase the duration of the plasma nitridation procedure to increase the nitrogen content of the nitrided oxide dielectric layer 220 (FIG. 2B). Such modification in the nitridation process is expected to decrease the removal rate of the nitrided oxide dielectric layer 220 during the etch process (FIG. 2C).

Figure 2E:
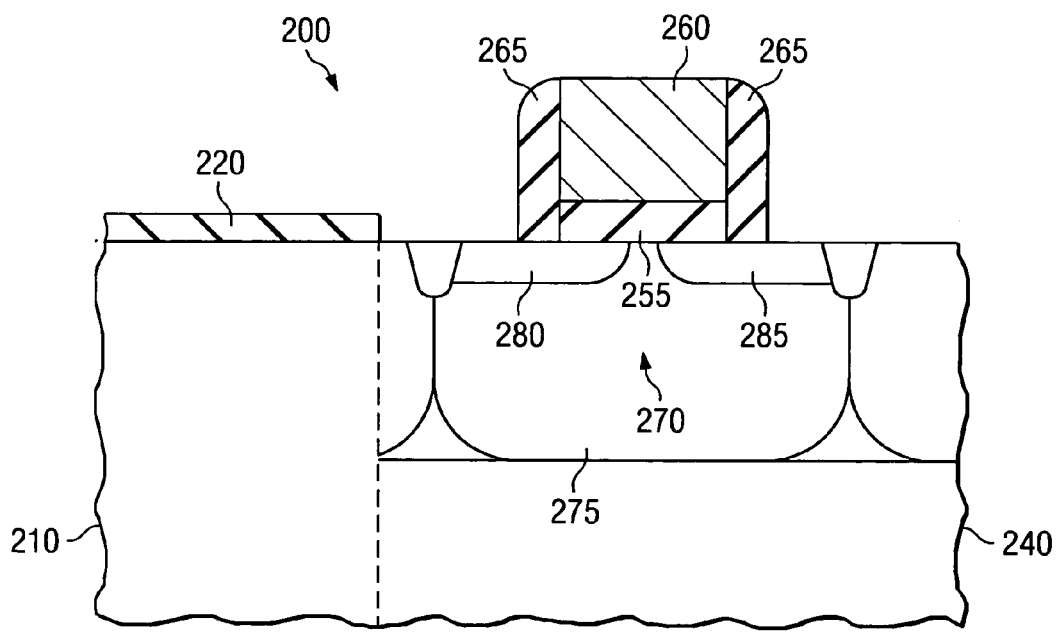

FIG. 2E illustrates the semiconductor device 200 after further processing steps to form other components of the device 200. In certain preferred embodiments, the nitrided oxide dielectric layer 220 on the production substrate 240, shown in FIG. 2D, is patterned using conventional lithography procedures to form a gate dielectric 255. In certain preferred embodiments, the gate dielectric 255 is a low voltage gate dielectric having a thickness between about 10 and about 20 Angstroms.

Certain embodiments of the semiconductor device 200 further include a gate 260 formed over the gate dielectric 255, gate sidewalls 265, a p or n tub 270, active region 275, and source and drain 280, 285 formed in the production substrate 240 to form a transistor device 200, such as a MOSFET. One skilled in the art would understand that alternative embodiments of the semiconductor device 200 include active and passive semiconductor devices such as capacitors. It should be noted that while the metal levels and corresponding interconnects are not shown, those who are skilled in the art understand how to complete such devices.

Figure 3A:
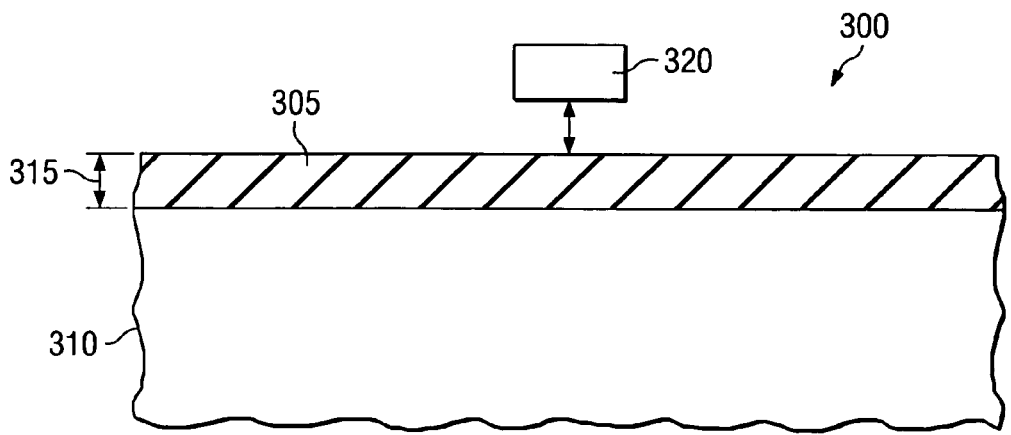
FIGS. 3A to 3E illustrate sectional view of selected steps in a process for manufacturing an integrated circuit.
Figure 3B:
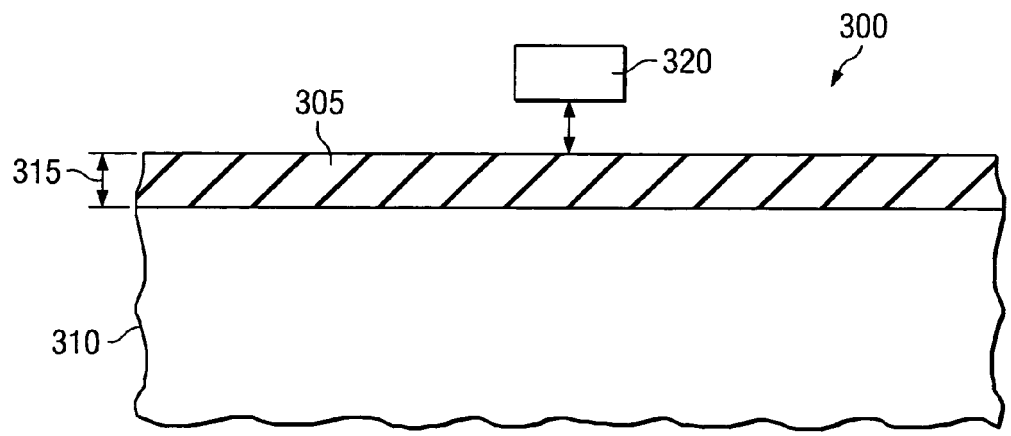
Figure 3C:
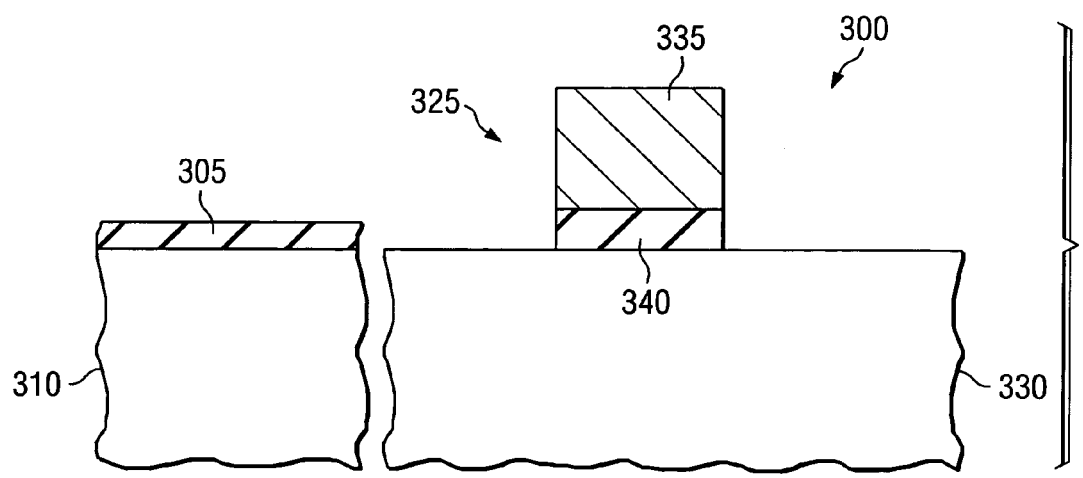

Yet another embodiment is a process for manufacturing an integrated circuit. FIGS. 3A–3C, illustrate sectional views of selected steps in a process of manufacturing an integrated circuit 300. The integrated circuit 300 may include CMOS, BiCMOS devices, bipolar or other types of conventional integrated circuit components. Any of the embodiments of monitoring the process for forming the nitrided oxide dielectric or manufacturing the semiconductor device, illustrated in FIGS. 1 and 2, respectively, can be incorporated into the process for manufacturing the integrated circuit 300.

Turning to FIG. 3A, the process of manufacturing an integrated circuit 300 includes forming a test nitrided oxide layer 305 on a test substrate 310 using an oxide nitridation process. Similar to previously discussed embodiments, the test layer 305 has a property, such as thickness 315, that preferably is measured, via an optical spectrometer 320, schematically represented by the box, before the next step in the process.

As shown in FIG. 3B, the process of manufacturing an integrated circuit 300 further includes exposing the test nitrided oxide layer 305 to the etch process, as discussed above, resulting in a change in the property. For example, a decrease in the thickness 315 of the test layer 305, is recorded by the optical spectrometer 320. A change in a property of the test layer 305 is thus measured as a function of the etch process similar to that discussed previously.

As illustrated in FIG. 3C, the process of manufacturing an integrated circuit 300 also includes forming one or more gate structures 325 on a production substrate 330. As previously discussed for other embodiments, the production substrate 330 may be located on the same or a different wafer than the test substrate 310. Forming the gate structure 325 includes forming a gate 335 on a production nitrided gate oxide layer 340. The production nitrided gate oxide layer 340 is formed using substantially the same oxide nitridation process as used to form the test layer 305, when the change in property of the test layer 305 as a function of the etch process falls within an accepted range, just discussed above with respect to FIGS. 3A and 3B.

Figure 3D:
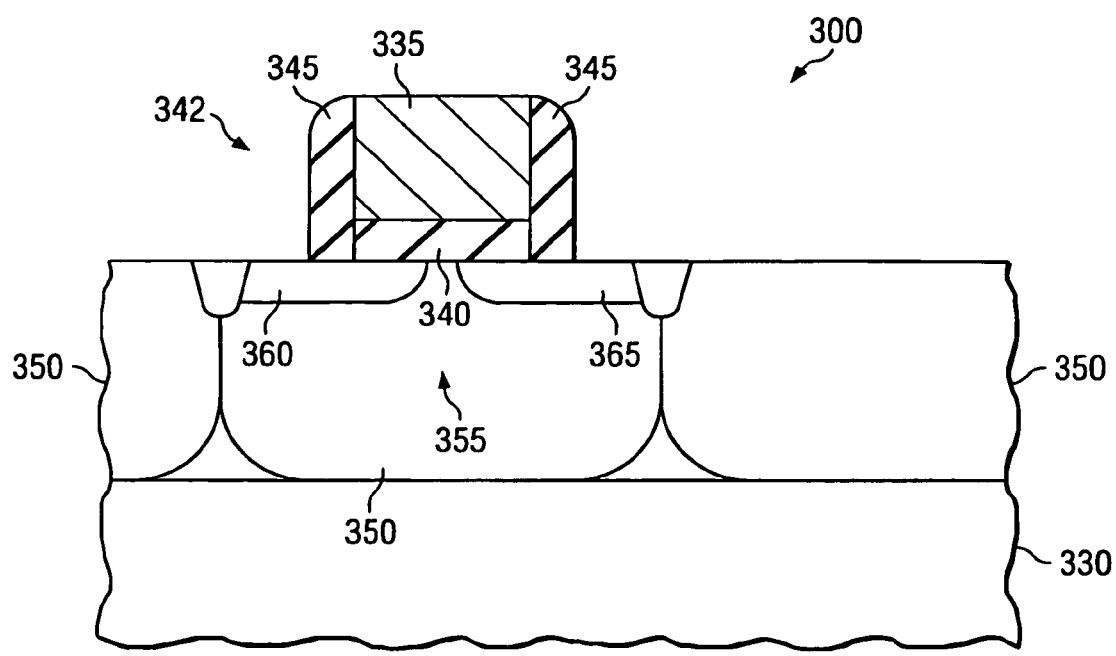
Figure 3E:
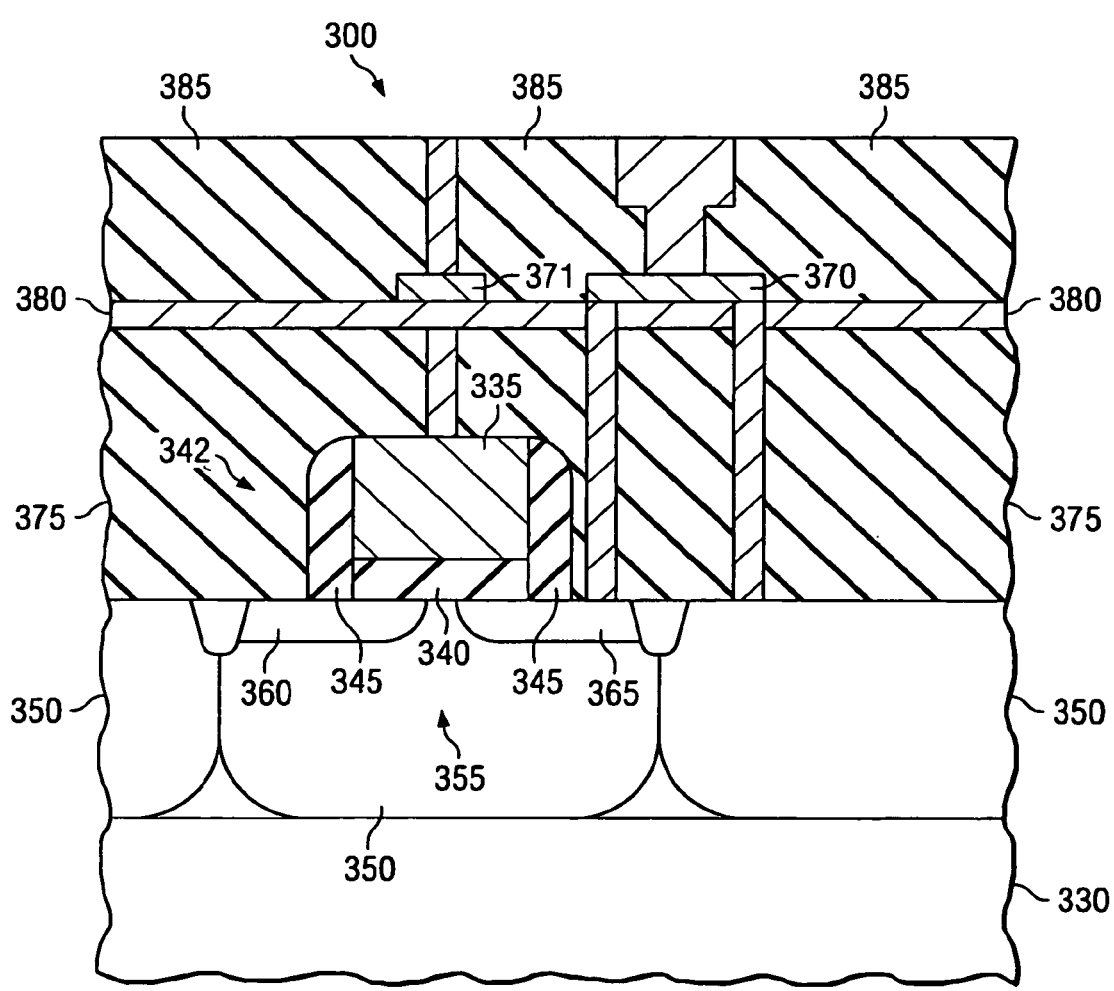

The process of manufacturing an integrated circuit 300 further includes, as shown in the partial sectional view of FIG. 3D, additional manufacturing steps to fabricate a transistor 342. In certain preferred embodiments, such steps include forming gate side walls 345, p or n tub 350, active region 355, and source and drain 360, 365, in or on the production substrate 330. FIG. 3E, which is also a partial sectional view, illustrates further steps in the process of manufacturing an integrated circuit 300, including forming interconnections 371, 370, in one or more insulating layers 375, 380, 385 to form an operative integrated circuit 300.

In certain preferred embodiments, the transistor 342 is a low voltage transistor having a nitrided gate oxide layer 340 with a thickness between about 10 and about 20 Angstroms. In other preferred embodiments, the transistor 342 is high voltage transistor having a nitrided gate oxide layer 340 with a thickness between about 20 and about 65 Angstroms.

Having described the present invention, it is believed that the same will become even more apparent by reference to the following examples. It will be appreciated that the examples are presented solely for the purpose of illustration and should not be construed as limiting the invention. For example, although the examples described below may be carried out in a laboratory setting, one skilled in the art could adjust specific numbers, dimensions and quantities up to appropriate values for a full-scale production plant setting.

EXAMPLES

Experiments were conducted to examine how nitridation affects the etch rate of an oxide layer. Layers of silicon dioxide were formed on silicon wafers to a thickness of about 25 Angstroms, using conventional thermal growth procedures. The thickness of the silicon dioxide layers were measured by conventional ellipsometry from 21 different locations on the wafer.

Individual wafers bearing the silicon dioxide layer were then exposed to predefined degrees of plasma nitridation and rapid thermal annealing. A conventional plasma nitridation process was performed. Plasma nitridation was carried out for either 0 (e.g., no plasma nitridation), or for between about 5 and about 180 seconds. Following plasma nitridation, a rapid thermal anneal (RTA) was performed on selected wafers at one of about 600° C., about 800° C. or about 1000° C. The RTA was carried out for between about 5 and about 60 seconds. Other wafers were not thermally annealed. The wafers were then transferred to a wet etch chamber and exposed to identical buffered HF solutions (1:100 mixture of 49% wt./vol. HF to 41% wt./vol. $NH_3F$) for different periods ranging from about 3 seconds to about 145 seconds, followed by conventional rinsing an drying procedures.

Figure 4:
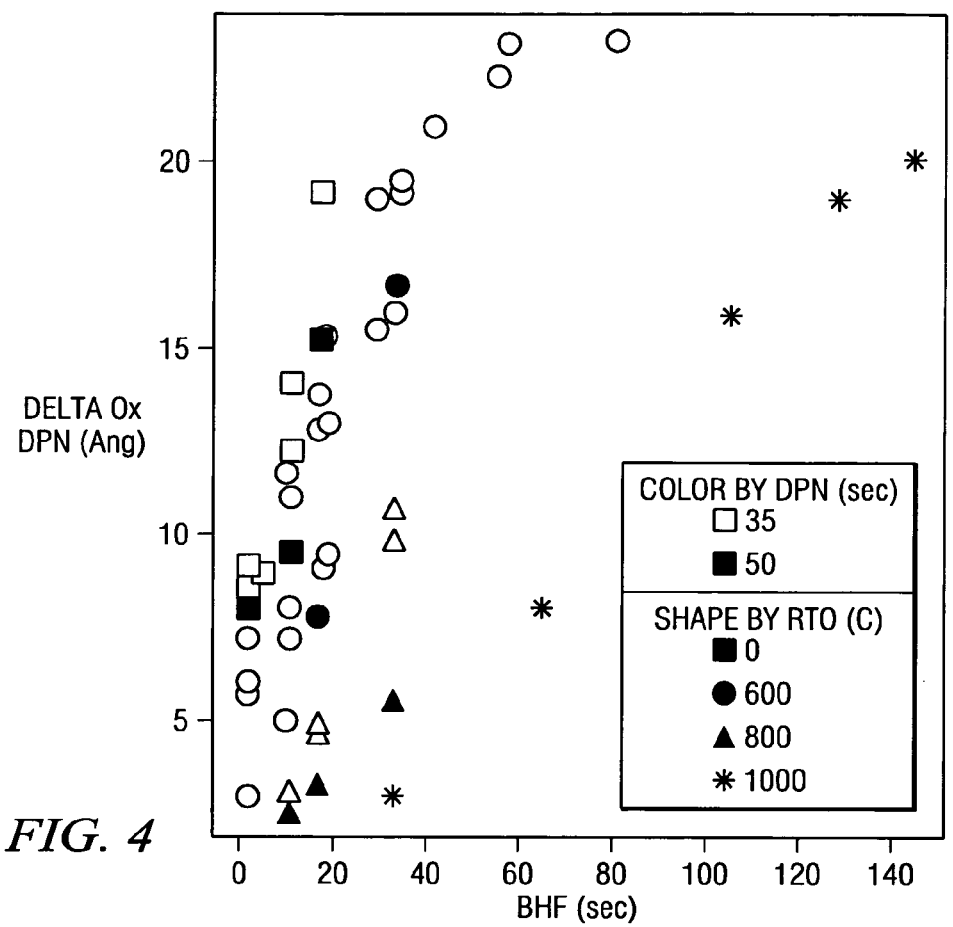
FIG. 4 presents exemplary data showing the relationship between etch rates of a nitrided oxide layer and plasma nitridation and rapid thermal anneal conditions used to form the nitrided oxide layer.

Following the etching process, the thickness of the wafers was then redetermined using the same procedures as described above. FIG. 4 presents exemplary data showing changes in the thickness of different nitridated oxide layers produced using different combinations of plasma nitridation and RTA treatments and then wet etched. The nitridated oxide layers were exposed to the buffered HF solution for periods up to about 145 seconds.

A linear regression analysis was performed to determine how the thickness of the oxide layer ($\Delta OX$) changes as a function of the duration of the plasma nitridation treatment (T-PN, seconds), RTA temperature (T-RTA, degrees Celsius) and etch time (T-etch, seconds). The follow equation was used:

$$\Delta OX = A \cdot (T\text{-}PN) + B \cdot (T\text{-}RTA) + C \cdot (T\text{-}etch) + D$$

A, B, C and D are adjustable coefficients and $\Delta OX$ is in units of Angstroms. In one analysis, for example, the best fit regression coefficients to a data set such as that depicted in FIG. 4, were: A=−0.155±0.074; B=−0.0348±0.0047; C=0.376±0.043; and D=31.5±3.6.

The results of this analysis were used to produce a standard nomogram showing the relationship between expected decreases in thickness of the nitridated oxide layer for different plasma nitridation and RTA conditions using a fixed etch time.

Figure 5:
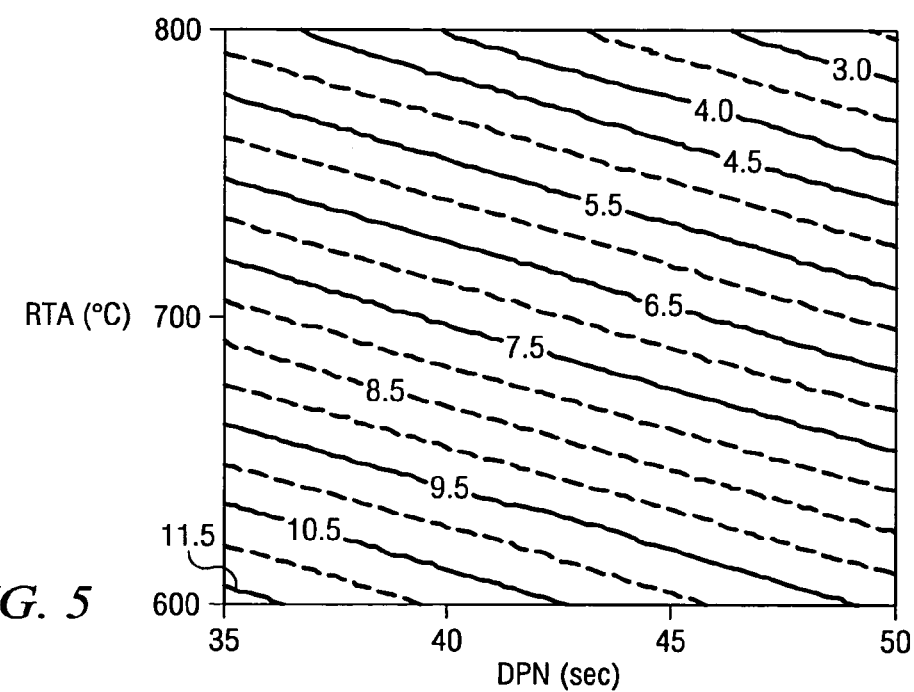
FIG. 5 presents an exemplary nomogram showing the predicted change in thickness of nitrided oxide layers formed using different conditions of plasma nitridation and rapid thermal annealing under fixed etching conditions.

FIG. 5 illustrates an exemplary standard nomogram for a fixed etch time of about 17 seconds. The standard nomogram is then used to predict the change in thickness for different combinations of plasma nitridation and RTA. For instance, the above-described etch process predicted to result in a decrease in thickness of about 11.5 Angstroms when performed on a silicon dioxide layer, nitridized with a plasma nitridation treatment for 35 seconds and subject to an RTA at 600° C. Alternatively, the coefficients from the above-described linear regression analysis can be used to predict an expected decrease in thickness of about 11.7 Angstroms.

Although the present invention has been described in detail, one of ordinary skill in the art should understand that they can make various changes, substitutions and alterations herein without departing from the scope of the invention.

What is claimed is:

1. A method for determining one or more process parameters of a nitrided oxide film; comprising:
   receiving a wafer having a pre-formed nitrided oxide film having a first thickness, formed under a predetermined process including the one or more process parameters;
   measuring the first thickness;
   etching the film for a pre-determined etch time;
   measuring the post-etching film-thickness and calculate a first change in thickness;
   accessing an etch-rate reference of a nitrided oxide film formed under known process parameters including the one or more process parameters of the pre-determined process;
   determining from the reference an expected film thickness change corresponding to the pre-determined process and the pre-determined etch time;
   comparing the first change in thickness to the expected film thickness change; and
   if the difference between the first change in thickness and the expected film thickness change is within a pre-determined range forming nitride oxide in layer on a production wafer.

2. The method as recited in claim 1, wherein said etching step includes exposing said nitrided oxide film to a hydrofluoric acid solution.

3. The method as recited in claim 2, wherein said hydrofluoric acid solution further includes ammonium fluoride.

4. The method as recited in claim 1, wherein said etching step further includes exposing said nitrided oxide film to an aqueous solution of 49% (wt/vol) hydrofluoric acid and 41% (wt/vol) ammonium fluoride in a ratio of 1:100, respectively.

5. The method as recited in claim 1, the measuring step uses an optical spectroscopy.

6. The method as recited in claim 1, wherein said measuring is conducted at a plurality of locations across a surface of said nitrided oxide film.

7. The process as recited in claim 1, further includes the step of applying the nitrided oxide film to the formation of transistors in the substrate if said first change in film-thickness is within an accepted value.

8. The process as recited in claim 1, wherein said pre-determined process is modified if said first change in film-thickness is substantially different from the expected film thickness the expected value.

9. The process as recited in claim 1, wherein said wafer substrate comprises silicon.

10. The process as recited in claim 1, wherein said nitrided oxide layer comprises silicon dioxide.

11. The process as recited in claim 1, wherein said nitrided oxide layer is between about 5 Angstroms and 30 Angstroms thick.

12. The process as recited in claim 1, wherein said preformed nitrided oxide film is formed by a rapid thermal anneal after a nitridation.

13. The process as recited in claim 1, wherein said preformed nitrided oxide film is a gate dielectric of transistors on said wafer.

14. The process as recited in claim 13, wherein said gate dielectric is a low voltage gate dielectric.

15. The process as recited in claim 13, wherein said transistors include a low voltage transistor having a nitrided gate oxide layer that is between about 10 and about 20 Angstronis thick.

16. The process as recited in claim 13, wherein said transistors include a high voltage transistor having a nitrided gate oxide layer that is between about 20 and about 65 Angstroms thick.

* * * * *